United States Patent [19]
Williams

[11] Patent Number: 5,818,381
[45] Date of Patent: Oct. 6, 1998

[54] ELECTRONIC VIEWING AID

[75] Inventor: Roscoe Charles Williams, Kempston, United Kingdom

[73] Assignee: Roscoe C. Williams Limited, United Kingdom

[21] Appl. No.: 765,082

[22] PCT Filed: Apr. 5, 1995

[86] PCT No.: PCT/GB95/00782

§ 371 Date: Dec. 20, 1996

§ 102(e) Date: Dec. 20, 1996

[87] PCT Pub. No.: WO96/00401

PCT Pub. Date: Jan. 4, 1996

[30] Foreign Application Priority Data

Jun. 24, 1994 [GB] United Kingdom .................. 9412772

[51] Int. Cl.$^6$ .............................. G01S 13/93; G01S 13/06; G01S 13/56
[52] U.S. Cl. ................................................................ 342/24
[58] Field of Search ................................................ 342/24

[56] References Cited

U.S. PATENT DOCUMENTS

| | | | |
|---|---|---|---|
| 2,500,638 | 3/1950 | Krauth | 342/24 X |
| 2,511,599 | 6/1950 | Rochester | 342/24 X |
| 2,560,587 | 7/1951 | Miller | 342/24 X |
| 3,172,075 | 3/1965 | Kay | 342/24 X |
| 3,366,922 | 1/1968 | Kay | 342/24 X |
| 3,383,682 | 5/1968 | Stephens, Jr. | 342/24 X |
| 3,611,374 | 10/1971 | Draysay | 342/28 |
| 3,654,477 | 4/1972 | Benjamin, Jr. | 250/217 SS |
| 3,987,402 | 10/1976 | Smith | 342/175 X |
| 4,310,903 | 1/1982 | Kay | 367/102 |
| 5,199,705 | 4/1993 | Jenkins et al. | 273/26 C |
| 5,229,885 | 7/1993 | Quaglia | 359/665 |
| 5,515,056 | 5/1996 | Henderson et al. | 342/125 |

FOREIGN PATENT DOCUMENTS

| | | |
|---|---|---|
| 531877 | 3/1993 | European Pat. Off. . |
| 2562679 | 10/1985 | France . |
| 2931837 | 2/1981 | Germany . |
| 3133645 | 3/1983 | Germany . |
| 3613258 | 10/1987 | Germany . |
| 2276055 | 9/1994 | United Kingdom . |

*Primary Examiner*—John B. Sotomayor
*Attorney, Agent, or Firm*—Leo Zucker

[57] ABSTRACT

An electronic viewing aid according to the present invention comprises a small-scale, portable personal radar system adapted to be worn by a person, which radar system includes a miniaturised radar front end assembly (22) operating with millimeter wavelength electromagnetic radiation, an electrical power source, signal processing means and a sensory output means. In a preferred embodiment of the invention, the radar front end assembly (22) is constructed in the form of a pair of spectacles (76), in which both a transmit antenna (78) and a receive antenna (90) of the radar system are carried on respective lens elements (75) of the spectacles (76) and analogue portions of both a transmitter circuit and a receiver circuit are carried on respective side support frames of the spectacles (76); and the sensory output means is an audio output means including stereo headphones (98).

12 Claims, 11 Drawing Sheets

ELECTRONIC VIEWING AID

TECHNICAL FIELD

This invention relates to an electronic viewing aid as specified in the preamble of claim 1, for example as disclosed in DE-A-29 31 837.

BACKGROUND ART

Radar systems are well known for an ability to detect and track stationary and moving targets, and have achieved wide-spread use in navigation systems for vehicles such as aircraft and shipping. The size, complexity and expense of such systems, however, preclude the small-scale use of such systems by an individual observer. Although radar systems of a smaller size have been developed for use as speed detectors in motor vehicle traffic control and as proximity detectors in motor vehicles, as disclosed in EP-A-0 531 877, for example, none of these smaller sized radar systems could be said to be easily portable by a person, particularly in view of the power requirements of such radar systems.

Portable viewing aids have been suggested in the past which use either a beam of ultra-sonic radiation, as disclosed, for example, in DE-A-29 31 837, or a beam of coherent light, as disclosed, for example, in U.S. Pat. No. 3,654,477, to detect the presence of obstacles. Unfortunately, such viewing aids tend to have difficulty in discriminating between various obstacles detected in the range of the viewing aids, and there is a tendency for such beams to become scattered or absorbed by the surroundings of said detected obstacles. A viewing aid disclosed in FR-A-2 562 679 utilises an optical sensor mounted on the frame of a pair of spectacles in order to detect changes in the ambient light falling upon the spectacles, these changes being conveyed as audible tones to a wearer of the spectacles. Such a viewing aid is of limited use in the detection of obstacles by a blind or partially-sighted person.

Consequently, there is a need for a small-scale portable radar system which could be used, for example, to aid blind or partially-sighted persons to adequately and readily guide themselves around their environments by providing them with a means to detect and track stationary and moving objects within their immediate vicinity.

DISCLOSURE OF INVENTION

An electronic viewing aid according to the present invention is characterised by the features specified in the characterising portion of claim 1.

Preferably the radar front end assembly is adapted to be worn on the head of the user, i.e., the person using the personal radar system, since this provides a simple scanning mechanism for the radar front end assembly as a result of the head of the user being moved up or down or to the left or to the right. Thus the radar front end assembly is mounted upon a natural two-degree of freedom platform, and there is no requirement to build into the assembly any form of powered scanning mechanism in order to render it fully operational. In a preferred embodiment of the present invention, the radar front end assembly is constructed in the form of a pair of spectacles, in which both a transmit antenna and a receive antenna of the radar system are carried on respective lens elements of the spectacles and analogue portions of both a transmitter circuit and a receiver circuit are carried on respective side support frames of the spectacles.

The electronic viewing aid according to the present invention is devised to operate with electromagnetic radiation whose wavelength lies in the millimetre region, with frequencies which lie between 35 and 220 gigahertz (GHz). The frequency used to operate the preferred embodiment of the present invention is 94 GHz.

The electrical power supply and the signal processing means are both mounted in a convenient package designed to be worn as either a belt-pack, a chest-pack, or a back-pack by the user.

An output signal from the signal processing means is fed by means of a suitable cable to a sensory output means, which sensory output means translates this output signal into a sensory signal which is both detectable and readily understandable to the user. Such a sensory signal could be one detectable by any one of the five human senses, namely sight, sound, smell, touch or taste. In the preferred embodiment of the present invention, which is designed specifically to aid a blind or partially-sighted person, the sensory output means is an audio output means, and delivers an audio signal directly to earphones worn by the user.

The radar system used in the electronic viewing aid of the present invention has been reduced in size both by the choice of the small wavelength of the operating radiation used and the use of miniaturising techniques in the fabrication of the system. Thus microstrip technology is used to produce the various transmission lines and passive electronic components required in radio-frequency (RF) and intermediate frequency (IF) stages of the system, and thick film hybrid techniques are utilised for low frequency components of the system. Expensive machined components such as wave guides are not used in the system. In the preferred embodiment of the invention, the radar system used is a frequency-modulated continuous wave type, which is lower in cost than some of the other types of possible radar system, such as, for example, the monopulse type of radar system.

A feature of the electronic viewing aid of the present invention is that, by using an operating radiation of millimetre wavelength and microstrip fabrication technology, it is possible to produce planar phased array antennae which possess very narrow beam width characteristics, e.g., 2 degrees at 94 GHz. Thus a user of the electronic viewing aid can scan a particular volume of space and can readily determine the physical existence and extent of any objects therein, provided that those objects do not subtend an angle of less than two degrees at the antennae of the radar system. This means in practice that the user can detect objects as small as 2.5 cm in size at a distance of 1 metre.

Moreover, the operating radiation of millimetre wavelength used in the electronic viewing aid of the present invention is subject to relatively low levels of attenuation in environments having low visibility, such as fog, dust or smoke. Thus, for example, the one-way attenuation of 94 GHz radiation in thick fog is approximately 3 dB/km, whereas it is approximately 100 dB/km for infra-red radiation. The penetration of fog and smoke by 94 GHz radiation is clearly far superior to that of infra-red radiation. Consequently, the electronic viewing aid of the present invention, being both readily portable and adapted to be worn by the user, can be used by fire-fighters when they are operating in the presence of thick smoke or flame in order to detect the presence of any objects or obstacles visibly obscured by said thick smoke or flame.

BRIEF DESCRIPTION OF DRAWINGS

FIG. 11b is a graphical representation of a signal generated within the microstrip circuit shown in FIG. 11a;

FIG. 11c is a graphical representation of an output signal generated within the microstrip circuit shown in FIG. 11a;

BEST MODE FOR CARRYING OUT THE INVENTION

Figure 1:
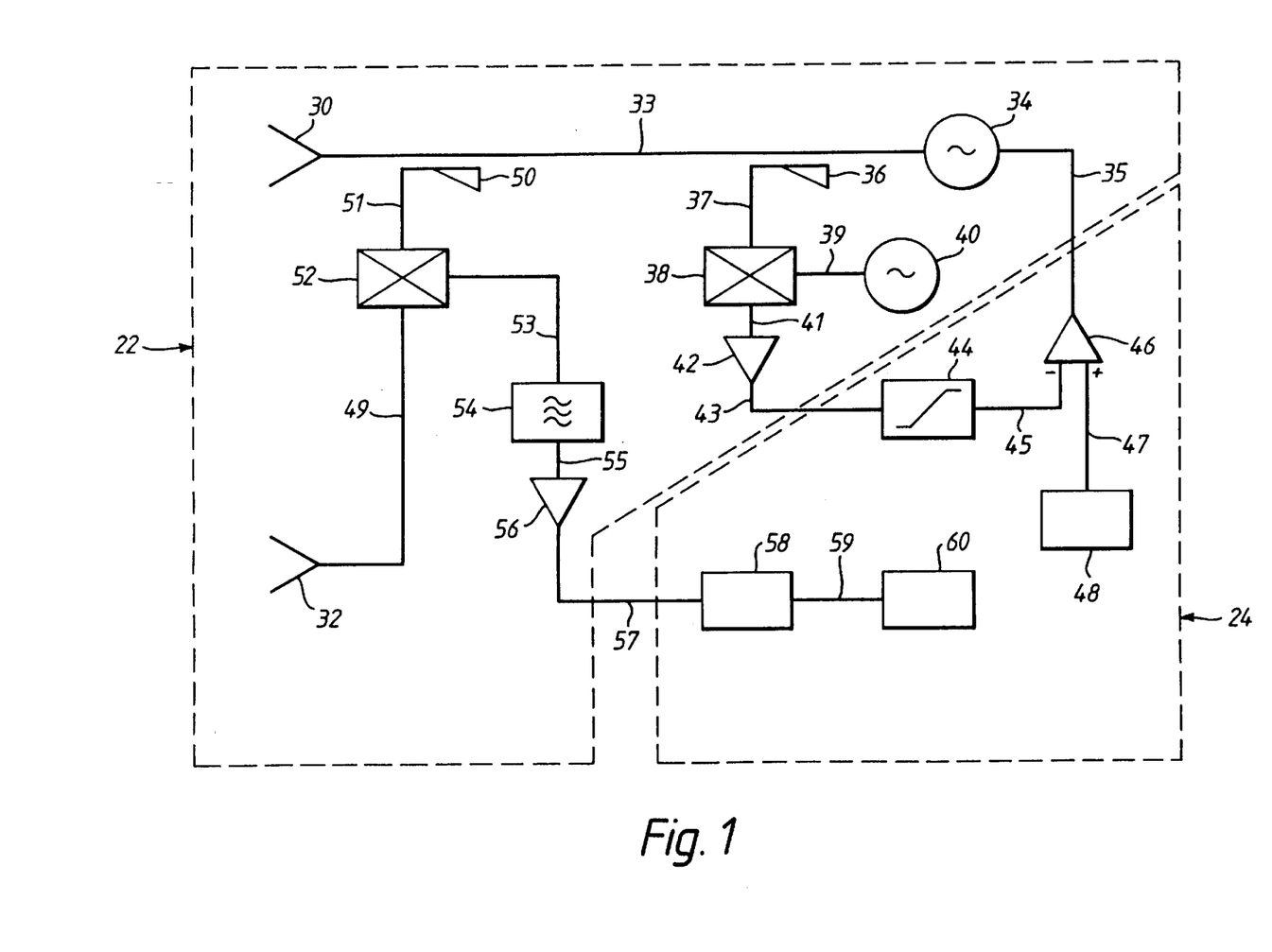
FIG. 1 is a schematic circuit drawing of a preferred embodiment of a radar system of an electronic viewing aid according to the present invention.

A preferred embodiment of an electronic viewing aid according to the present invention is illustrated in FIGS. 1 to 14, in which a radar front end assembly of the electronic viewing aid is in the form of a Spectacle-Mounted Antennae, Receiver and Transmitter system 22 (hereinafter referred to as a SMART system 22). Referring now to FIG. 1, this shows a schematic circuit drawing for the SMART system 22 and portions of a belt-mountable signal processing and power pack unit 24 of the preferred embodiment of the electronic viewing aid. The SMART system 22 includes a transmit antenna 30 and a receive antenna 32. Transmit antenna 30 is connected by a microstrip transmission line 33 to the output of a transmitter closed loop circuit which includes a voltage-controlled oscillator 34, a coupler 36, a harmonic mixer 38, a local oscillator 40, an amplifier 42, a linear frequency discriminator 44 and a summing amplifier 46.

In the operation of this closed loop circuit, the local oscillator 40 produces a stabilised local oscillator (LO) frequency signal which is fed to one input of the harmonic mixer 38 through a microstrip transmission line 39. A small amount of radio-frequency (RF) energy is taken from the transmission line 33 by the coupler 36, and is fed to a second input of the harmonic mixer 38 through a microstrip transmission line 37. The harmonic mixer 38 mixes the RF signal from the coupler 36 with the LO frequency signal from the local oscillator 40 to obtain a beat frequency, termed the intermediate frequency (IF), which is fed to the input of the intermediate frequency amplifier 42 through a microstrip transmission line 41. Components 36, 38, 40 and 42 all form part of the SMART system 22.

The output signal from the IF amplifier 42 is fed through an output line 43 to a linear frequency discriminator 44 which is housed within the belt-pack unit 24. The frequency discriminator 44 produces an output voltage signal which is fed into one input of the summing amplifier 46 through an output line 45. The summing amplifier 46 is also housed within the belt-pack unit 24, along with a linear ramp generator 48. The linear ramp generator 48 produces a saw-tooth voltage signal which is fed to a second input of the summing amplifier 46 through an input line 47. An output signal from the summing amplifier 46 is fed to an input of the voltage-controlled oscillator 34 through an output line 35. The voltage-controlled oscillator 34 incorporates a voltage-controlled Gunn diode, and is described in more detail hereinafter with reference to FIGS. 12a and 12b. The wave form of the output signal from the summing amplifier 46 produces an output signal from the voltage-controlled oscillator 34 which is frequency modulated, and this frequency-modulated output signal is fed to the transmit antenna 30 through the microstrip transmission line 33 to close the loop.

This closed loop transmitter circuit uses the frequency discriminator 44 to provide a feedback signal which stabilises the tuneable voltage-controlled oscillator 34. Voltage-controlled oscillator 34 is effectively "locked" to a tuning characteristic of the frequency discriminator 44, as is shown graphically hereinafter with reference to FIGS. 11b and 11c. Since this tuning characteristic is linear, the voltage-controlled oscillator 34 will be tuned linearly.

A user of this preferred embodiment of the electronic viewing aid of the invention will wear the SMART system 22 on his or her head in a similar manner as wearing a pair of spectacles. During the operation of the electronic viewing aid, the radar signal transmitted from the transmit antenna can be scanned over objects situated before the user by appropriate movement of the head of the user, and any such object scanned will scatter a certain fraction of the transmitted signal back to the receive antenna 32 of the SMART system 22. The return signal collected by the receive antenna 32 is fed to one input of a radio-frequency hybrid ring mixer 52 through a microstrip transmission line 49. A coupler 50 located adjacent the transmitter output line 33 acts as a local oscillator by taking a small portion of the transmitter signal and feeding it to a second input of the hybrid ring mixer 52 through a microstrip transmission line 51. The hybrid ring mixer 52 is described in more detail hereinafter with reference to FIG. 13. Hybrid ring mixer 52 produces an intermediate frequency (IF) signal which is a beat frequency that is the difference in frequency between the transmitted and received signals fed to the two inputs of the hybrid ring mixer 52.

The IF signal from the hybrid ring mixer 52 is fed through a microstrip transmission line 53 to an input of a low-pass filter 54, which is designed to allow only the IF signal to pass through to an input of an IF amplifier 56 via a microstrip transmission line 55. The IF amplifier 56 produces an amplified IF output signal which is fed to an input of an analogue-to-digital converter (ADC) 58 through an output line 57. The amplified IF signal is converted from an analogue signal to a digital signal by the ADC 58, and the digital output signal from the ADC 58 is passed to an input of a signal processing unit 60 through an output line 59. Both the ADC 58 and the signal processing unit 60 are housed in the belt-pack unit 24.

The signal processing unit 60 computes the range and velocity of the object(s) detected relative to the user, and, where possible, identifies said object(s). The signal processing unit 60 contains object-recognition algorithms to aid in the identification of detected objects, and generates an audio output signal embodying all of the detected characteristics of said object(s). This audio signal is fed to an output audio cable 102 connected to stereo earphones 98 worn by the user (see FIG. 5).

Figure 2:
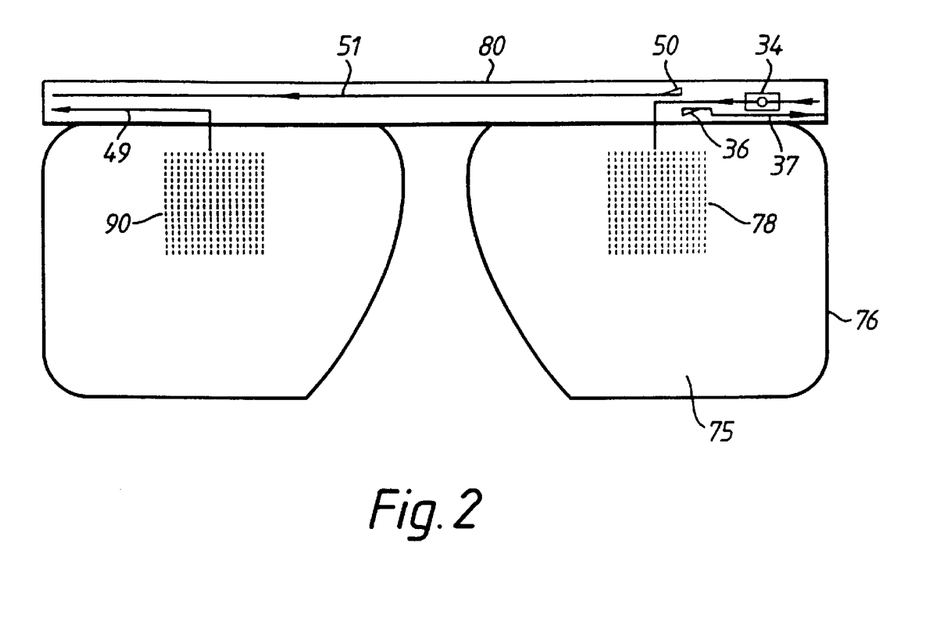
FIG. 2 is a front view of a pair of spectacles which forms a front end assembly of the radar system shown in FIG. 1.
Figure 3:
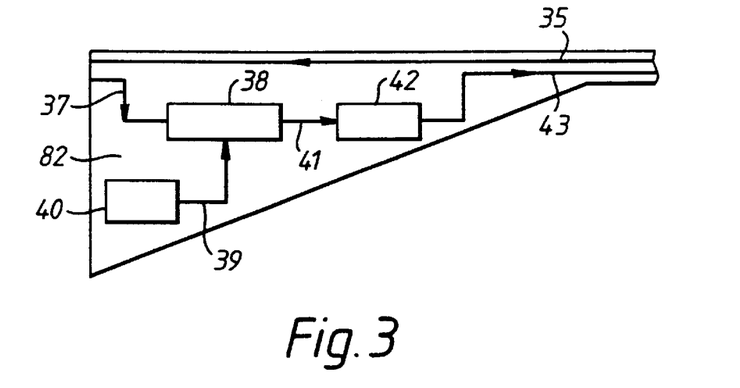
FIG. 3 is a view of a left side frame of the spectacles shown in FIG. 2.
Figure 4:
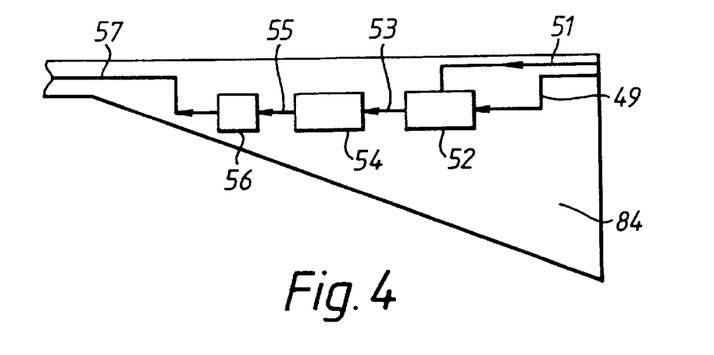
FIG. 4 is a view of a right side frame of spectacles shown in FIG. 2.

Turning now to FIGS. 2, 3 and 4, these illustrate the desired configuration of the SMART system 22 of the preferred embodiment of the invention. FIG. 2 shows a front view of the SMART system 22, from which it can be seen that it comprises a pair of lens-like elements 75 supported by a frame 76 having an upper, horizontal cross-bar 80. The lens-like elements 75 are formed from a suitable dielectric substrate such as quartz, and the cross-bar 80 is a rectangular piece of a suitable dielectric substrate (e.g., alumina) mounted upon a metal ground plane. The right-hand element 75, as viewed in FIG. 2, carries a planar chased array 78 which constitutes the transmit antenna 30 of FIG. 1, and the left-hand element 75, as viewed in FIG. 2, carries a similar planar phased array 90 which constitutes the receive antenna 32 of FIG. 1. The cross-bar 80 carries thereon the voltage-controlled oscillator 34, the coupler 36, and the microstrip transmission lines 33, 35 and 37 of the transmitter circuit of the radar system shown in FIG. 1, and the coupler 50 and the microstrip transmission lines 49 and 51 of the receiver circuit of the radar system shown in FIG. 1.

FIG. 3 is a side view of the SMART system 22, showing a left-hand frame support 82 for the Frame 76, which frame support 82 is made from a suitable dielectric material substrate, such as alumina, mounted on a metal ground plane. The frame support 82 carries thereon the harmonic mixer 38, the local oscillator 40, the amplifier 42 and the microstrip transmission lines 35, 37, 39, 41 and 43 of the transmitter circuit of the radar system shown in FIG. 1.

FIG. 4 is a side view of the SMART system 22, showing a right-hand frame support 84 for the frame 76, which frame support 84 is made from a suitable dielectric material substrate, such as alumina, mounted on a metal ground plane. The frame support 84 carries thereon the hybrid ring mixer 52, the low-pass filter 54, the IF amplifier 56 and the microstrip transmission lines 49, 51, 53, 55 and 57 of the receiver circuit of the radar system shown in FIG. 1.

Figure 5:
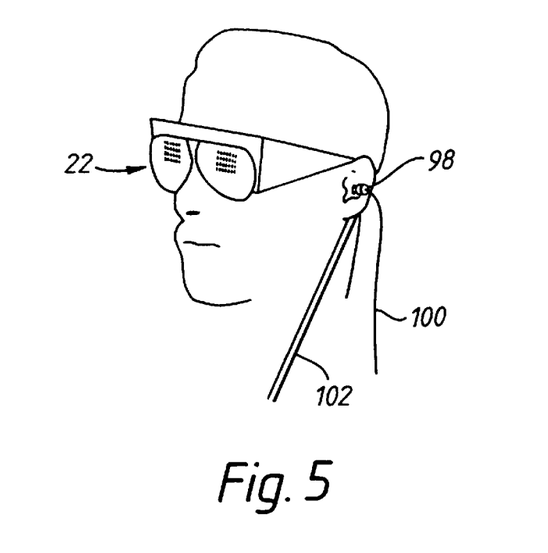
FIG. 5 is an isometric view of a user wearing the spectacles shown in FIGS. 2, 3 and 4.

FIG. 5 shows the SMART system 22 when worn by a user, along with the left-hand portion of a pair of stereo earphones 98, a portion of the audio output cable 100 extending from the belt-pack (not shown) and a portion of a power cable 102 which supplies DC power to the SMART system 22 from a battery pack (not shown) housed in the belt-pack.

Figure 6:
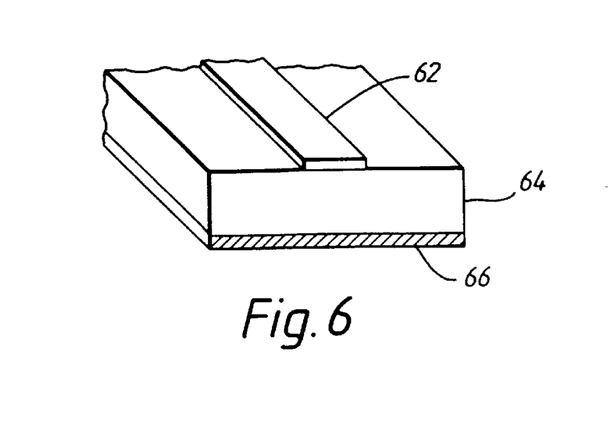
FIG. 6 is an isometric view, partially in section, of a portion of a microstrip transmission line used in the circuit of the radar system shown in FIG. 1.

FIG. 6 is an isometric, cross-sectional view of a portion of a microstrip transmission line as used for the transmission lines in the SMART system 22. As can be seen in FIG. 6, the transmission line comprises a metal strip conductor 62 deposited upon an upper surface of an insulating slab-like member 64 formed from a dielectric material, with a lower surface of the slab-like member 64 being plated with a metal conductive film 66.

Figure 7:
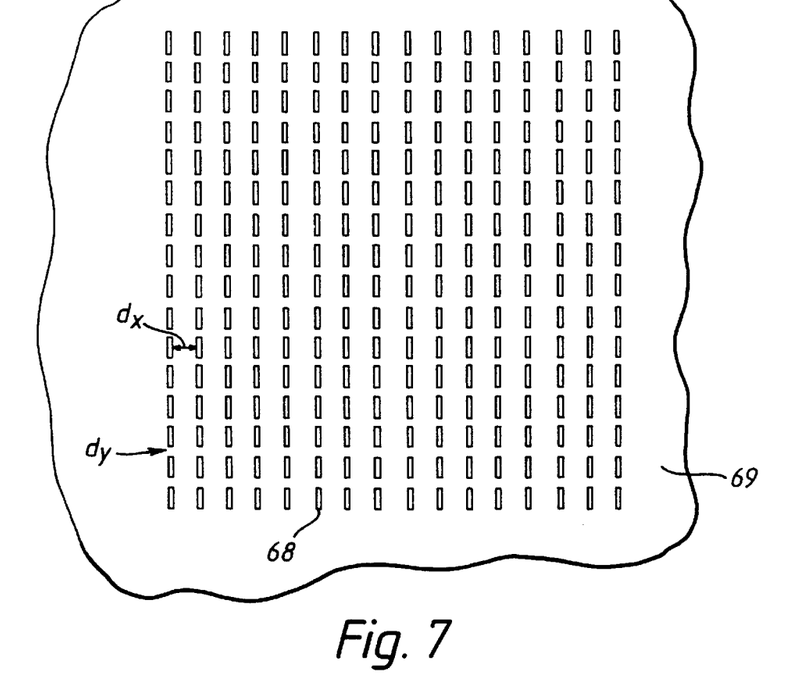
FIG. 7 is a plan view of a planar phased array shown in the spectacles in FIG. 2.
Figure 8:
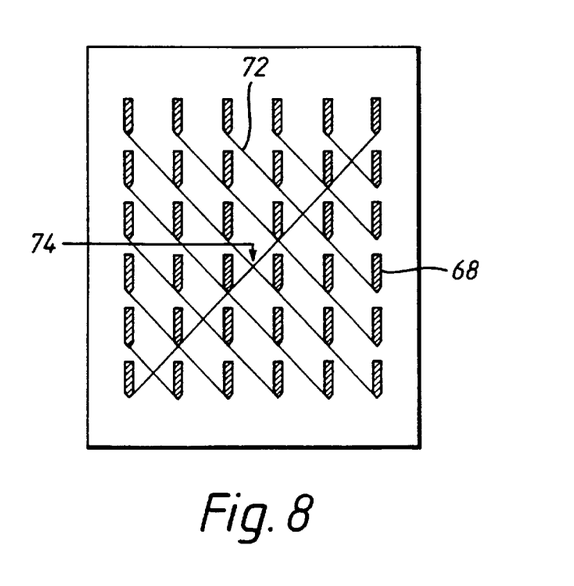
FIG. 8 is a plan view of a portion of the planar phased array shown in FIG. 7, illustrating a microstrip feed pattern for the array.

FIGS. 7 and 8 show details of the planar phased array as used for the transmit array 78 and the receive array 90 in the SMART system 22 as shown in FIG. 2. Each planar phased array comprises 64 metal microstrip elements 68 deposited in a 16×16 array upon the surface of a quartz substrate 69, which forms the respective lens-like element 75 of the SMART system 22 for the array. Each of the metal microstrip elements 68 is rectangular in shape, with a length of 0.752 mm and a width of 0.188 mm. The quartz substrate 69 has a thickness of 0.13 cm. As shown in FIG. 7, the horizontal distance $d_x$ between adjacent microstrip elements 68 is 1.063 mm, and the vertical distance $d_y$ between adjacent microstrip elements 68 is 0.3114 mm.

FIG. 8 shows a 6×6 array portion of the planar phased array of FIG. 7 to illustrate a preferred network arrangement of directly-fed elements 68 in which the elements 68 are connected together by a series of diagonal high impedance lines 72. The radiation fed to or from the array during the operation of the SMART system 22 enters the network of high impedance lines 72 from a common feed point 74 which extends through the quartz substrate 69 to a miniature co-axial connector (not shown) mounted thereon. An alternative method of feeding signal power to, for example, the elements 68 of the transmit array 78 is to connect each element 68 through the substrate 69 to a parallel feed network, so as to fan out the transmitted power to each element 68 through the substrate 69. Such a parallel feed network is not as cost-effective as the cross-fed array illustrated in FIG. 8.

Figure 9:
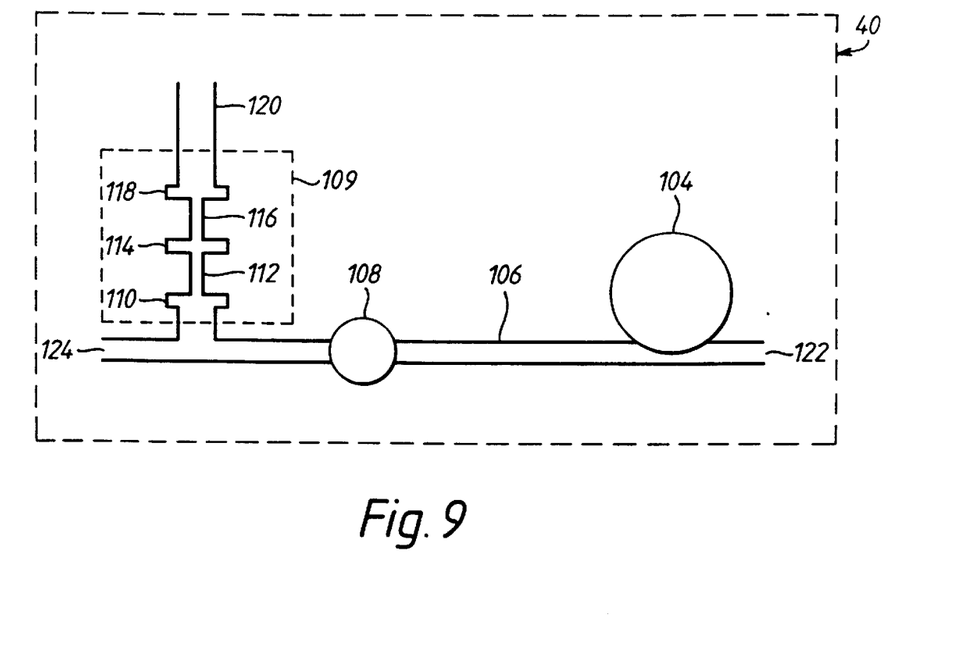
FIG. 9 is a schematic diagram of a microstrip circuit of a local oscillator component of the radar system shown in FIG. 1.

FIG. 9 shows circuit details of the local oscillator 40 of the transmitter closed loop circuit of the SMART system 22. The circuit components of the local oscillator 40 are mounted upon an alumina substrate having a relative dielectric constant of 9.6 and a thickness of 0.38 mm. The circuit components comprise a dielectric resonator 104, a Gunn/Impatt diode 108, and a low-pass filter 109. Dielectric resonator 104 is a cylinder with a radius of 1.3345 mm and a height of 1.01098 mm, formed of barium tetratitanate which has a dielectric constant of 36.5. The resonant frequency of the cylindrical resonator 104 is 23.25 GHz. The dielectric resonator 104 is connected to the Gunn/Impatt diode 108 via a 50 ohm microstrip transmission line 106, with the distance between the dielectric resonator 104 and the diode 108 being 5.0 mm. During the operation of the SMART system 22, the diode 108 is frequency-stabilised by reason of the dielectric resonator oscillating at a fixed frequency of 23.25 GHz. The low-pass filter 109 is positioned between the diode 108 and a radio-frequency output line 124 of the local oscillator 40, and DC power is fed to the local oscillator 40 from the power cable 102 via a 50 ohm input line 120. Low-pass filter 109 comprises an array of microstrip elements 110, 112, 114, 116 and 118, elements 110, 114 and 118 being capacitor elements with respective values of 0.0976 pF, 0.0891 pF and 0.0868 pF, and elements 112 and 116 being inductance elements with respective values of 0.4724 nH and 0.2956 nH. A microstrip transmission line 122 connected to the dielectric resonator 104 is coupled to a dummy load.

Figure 10:
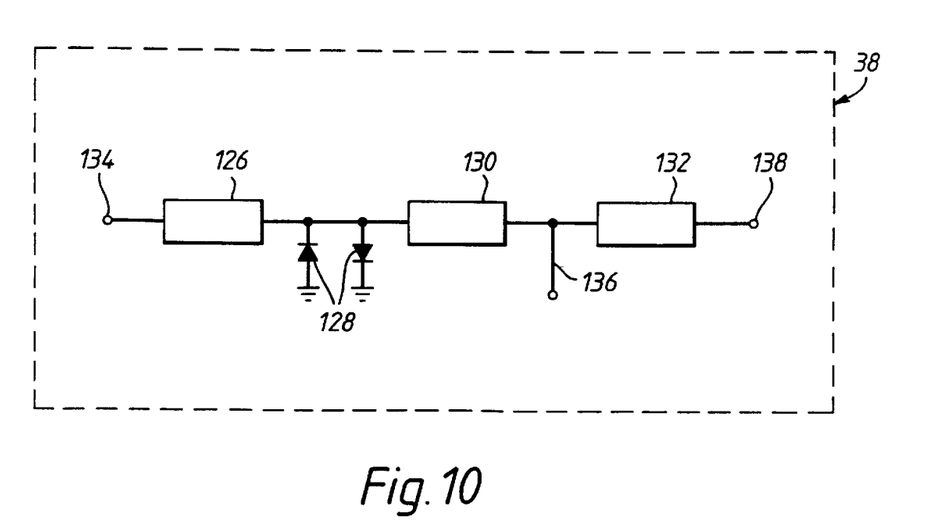
FIG. 10 is a schematic diagram of a microstrip circuit of a harmonic mixer component of the radar system shown in FIG. 1.

Turning now to FIG. 10, this shows the 10 microstrip circuit of the harmonic mixer 38 of the transmitter closed loop circuit of the SMART system 22. The circuit components of the harmonic mixer comprise a radio-frequency bandpass filter 126, two beam-lead diodes 128 arranged in an anti-parallel configuration, a low-pass filter 130 and an intermediate frequency filter 132, all connected together in series as shown. Filter 126 is provided with an input port 134, filter 132 is provided with an output port 138, and there is an input port 136 provided in the connection between filters 130 and 132. During the operation of the SMART system 22, the output from coupler 36 (see FIG. 1) is fed to port 134, the output from local oscillator 40 is fed to port 136, and the intermediate frequency output signal generated in the harmonic mixer 38 exits from port 138. During operation, the RF bandpass filter 126 is used to suppress all of the higher order of frequencies generated in the mixer 38, and to reject passage of the local oscillator frequency signal and the intermediate frequency signal. The RF bandpass filter 126 consists of a quarter wave line 0.2574 mm long, which gives sufficient rejection of the local oscillator signal and the IF signal during operation thereof. The low-pass filter 130 is used during operation to pass the local oscillator frequency signal whilst preventing the radio-frequency signal from reaching the local oscillator input port 136. This low-pass filter 130 has a cut-off frequency of 25 GHz. The intermediate frequency filter 132 has the same circuit configuration and component values as the low-pass filter 109 used in the local oscillator 40. It is used, during operation of the SMART system 22, to extract the intermediate frequency signal generated in the mixer 38 whilst preventing the local-oscillator signal and any other unwanted residual frequencies from reaching the output port 138. The IF filter 132 has a cut-off frequency of 22 GHz. The mixer 38 is designed to operate on the fourth harmonic of the local oscillator signal. Consequently, since the local oscillator signal is 23.25 GHz, the fourth harmonic thereof is a frequency of 93 GHz, and, with the radio-frequency signal having a frequency of 94 GHz, the intermediate frequency signal exiting the mixer 38 will have a frequency of 1 GHz.

Figure 11A:
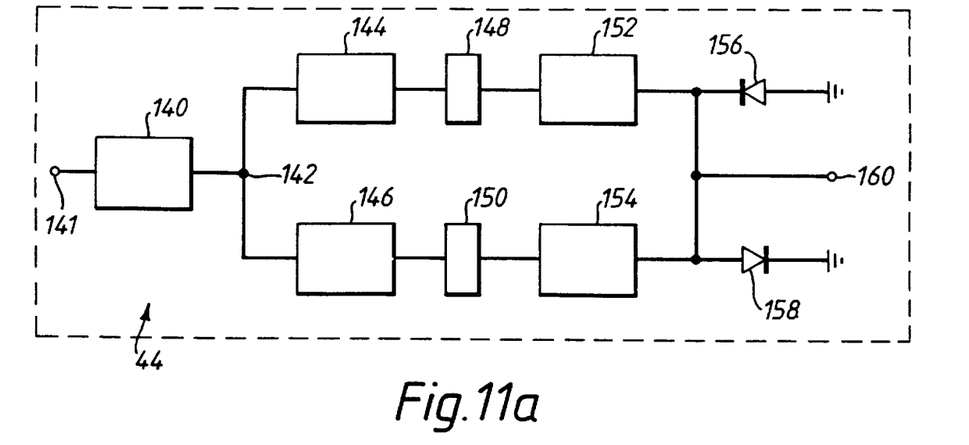
FIG. 11a is a schematic diagram of a microstrip circuit of a linear frequency discriminator component of the radar system shown in FIG. 1.

FIG. 11a shows the microstrip circuit of the linear frequency discriminator 44 of the transmitter closed loop circuit of the SMART system 22. The circuit components of the linear frequency discriminator 44 comprise a frequency divider 140 having an input port 141, a power splitter 142, matching networks 144 and 146 for respective resonators 148 and 150, matching networks 152 and 154 or respective diodes 156 and 158, and an output port 160. Since the LFD 44 is located in the digital section of the radar system that is housed in the belt-pack, the transmission lines connecting the circuit components together need not be of microstrip construction, but can be produced by printed circuit techniques or by wire. During the operation of the SMART system 22, the frequency divider 140 divides the intermediate frequency signal received at the input port 141 down to a range which is suitable for digital operation, e.g., MHz frequency, and feeds that divided signal to the power splitter 142, which performs a 3 dB power split of the signal. The split signals thus produced are Led respectively to the matching networks 144 and 146 for the respective resonators 148 and 150. The resonators 144 and 146 shown in FIG. 11a are quartz resonators, but they could be tuned passive circuits, tuned amplifiers or cavities, if desired, and, since the LFD 44 is located in the digital section of the radar system that is housed in the belt-pack, they could also be digital notch filters. The networks 144, 146, 152 and 154 can be passive or active matching networks. The pair of matching diodes 156 and 158 are arranged in an anti-parallel configuration, and are used to produce an output signal at the output port 160, as will now be described with reference to the graphs shown in FIGS. 11b and 11c.

Figure 11B:
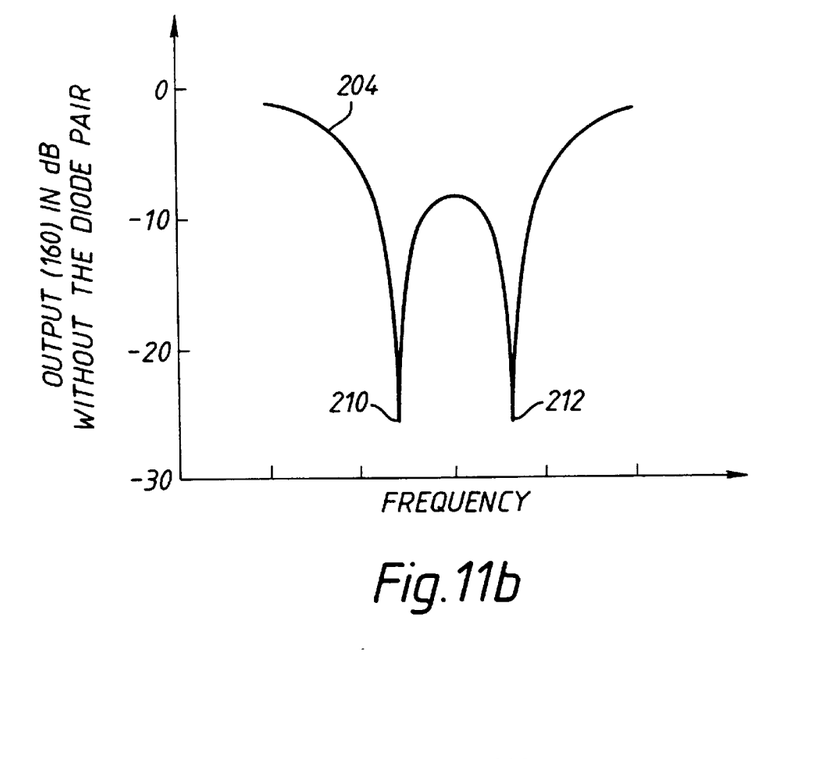
Figure 11C:
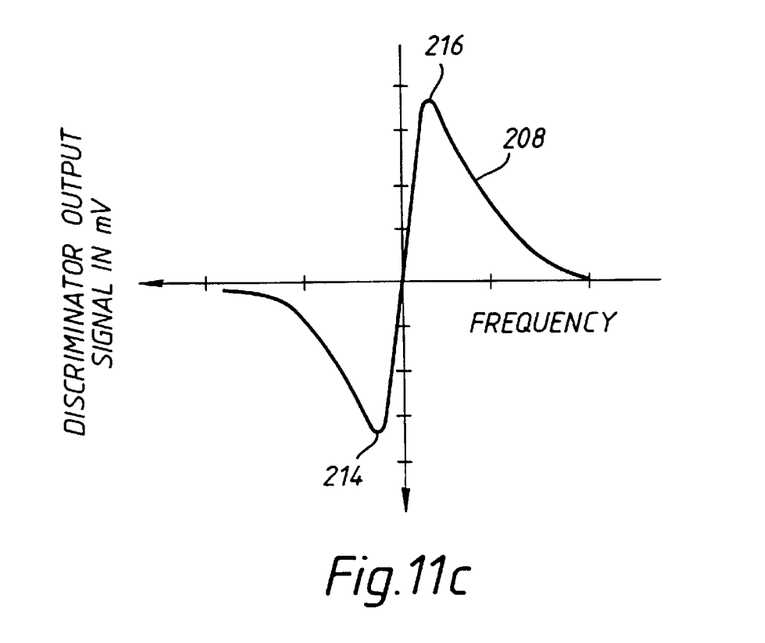

Referring first to FIG. 11b, this shows a graphical representation of the output 204 of the matching networks 152 and 154 when the RF signal at the input port 141 is scanned over the frequency range. As can be seen from the graph, the curve for the output 204 contains two troughs therein, indicated by the reference numbers 210 and 212 respectively. Trough 210 corresponds to the resonant frequency of the resonator 148, and trough 212 corresponds to the resonant frequency of the resonator 150. When the output signal 204 is fed to the pair of diodes 156 and 158, a discriminator output signal is produced at the output port 160 as a result of this diode pair combining the output signal 204, which discriminator output signal 208 is shown graphically in FIG. 11c. As can be seen in FIG. 11c, the curve for the output signal 208 contains a trough 214, which corresponds to the resonance trough 210 shown in FIG. 11b, and a peak 216, which corresponds to the resonance trough 212 shown in FIG. 11b.

As can be seen in FIG. 1, the output signal from the LFD 44 is fed to a negative input port on the summing amplifier 46, wherein it is combined with the saw-tooth voltage signal from the linear ramp generator 48, which is fed to a positive input of the summing amplifier 46, to produce an output signal which is fed to an input of the voltage-controlled oscillator 34.

Figure 12A:
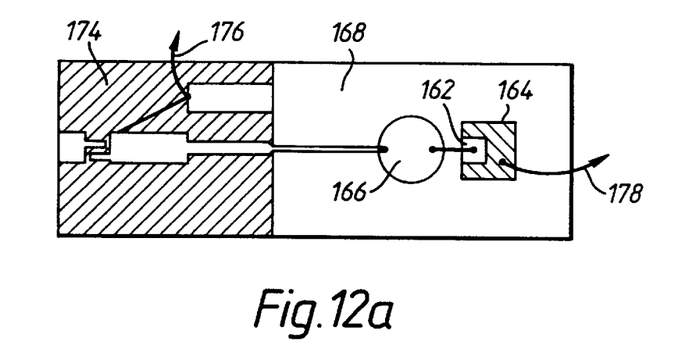
FIG. 12a is a plan view of a voltage-controlled oscillator component of the radar system shown in FIG. 1.
Figure 12B:
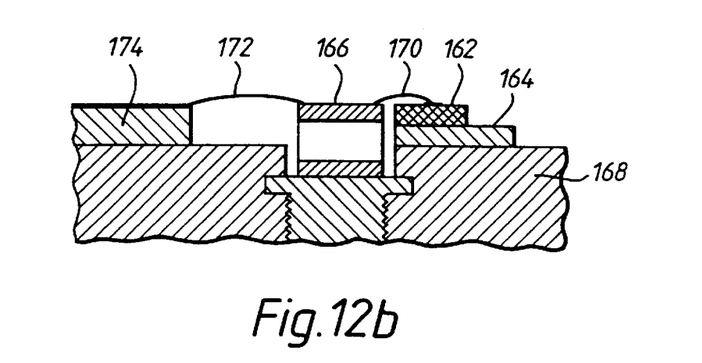
FIG. 12b is a cross-sectional view of a voltage-controlled oscillator component of the radar system shown in FIG. 1.

FIGS. 12a and 12b show details of the structure of the voltage-controlled oscillator 34. The main circuit components of the VCO 34 comprise a varactor 162, a bypass capacitor 164 and a Gunn diode 166, all mounted upon a metal carrier 168. As can be seen in FIG. 12b, the Gunn diode 166 has a threaded base which is screwed into a threaded aperture in the metal carrier 168, the varactor 162 is bonded to the Gunn diode 166 by a wire 170, and a gold ribbon 172 connects the Gunn diode to a two-section transformer 174 which is used for an impedance match in the VCO 34. As can be seen in FIG. 12a, a Gunn bias line 176 is provided which is connected to the power supply cable 102 of the SMART system 22, and a varactor bias line 178 is provided which is connected to the output line 35 from the summing amplifier 46 (see FIG. 1). The VCO 34 includes a dielectric substrate material of alumina.

Figure 13:
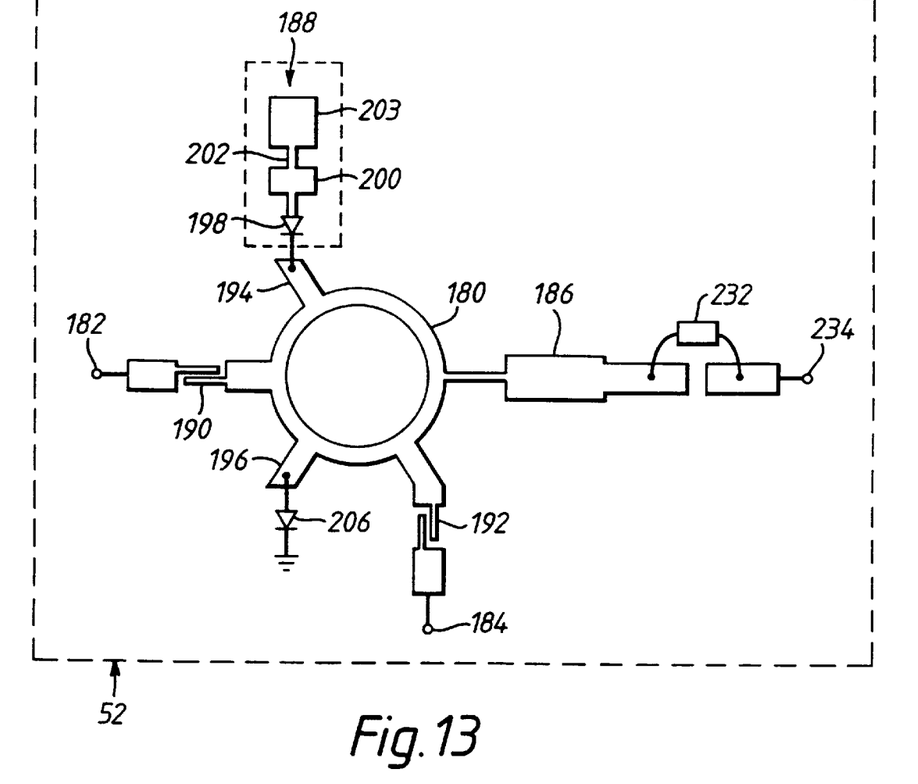
FIG. 13 is a schematic diagram of a microstrip circuit of a radio-frequency hybrid ring mixer component of the radar system shown in FIG. 1.

Turning now to the receiver section of the SMART system 22, FIG. 13 shows the circuit configuration of the hybrid ring mixer 52 in more detail. Ring mixer 52 is a microstrip hybrid ring (ratrace) mixer with a DC bias, fabricated on an alumina substrate having a thickness of 0.38 mm and a dielectric constant of 9.6. The main circuit components of the ring mixer 52 comprise a ring 180 of 70 ohms impedance, which has a sigma port 182 and a delta port 184, a low-pass filter 186 and a bias network 188. During operation of the SMART system 22, the radio-frequency signal received by the ring mixer 52 via line 49 (see FIG. 1) enters the ring 180 via the sigma port 182, passing through a low-frequency block 190 in the process. The delta port 184 receives the local oscillator signal on line 51 (see FIG. 1) and that signal enters the ring 180 through a low-frequency block 192. The low-frequency blocks 190 and 192 are used to prevent any shorting of the intermediate frequency or DC bias in the ring through ports 182 and 184. The ring 180 includes stubs 194 and 196, each having an impedance of 50 ohms. The bias network 188 is connected to the stub 194, and comprises a diode 198, a capacitor 200, an inductance 202, and a capacitor 203. DC bias is supplied to the ring 180 through this bias network 188. Stub 196 is grounded through a diode 206.

Figure 14:
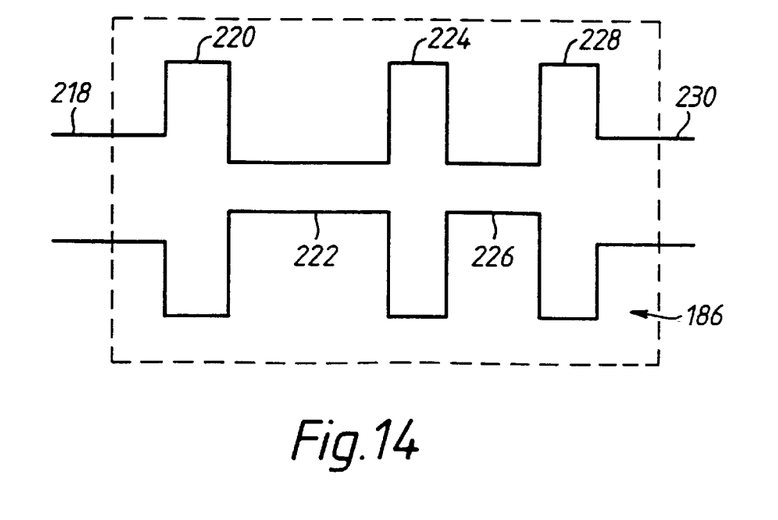
FIG. 14 is a schematic diagram of a microstrip circuit of a low-pass filter component of the radar system shown in FIG. 1.

The intermediate frequency signal generated in the ring mixer 52 leaves the mixer through the low-pass filter 186, the circuit configuration of which filter is disclosed in more detail in FIG. 14. As can be seen in FIG. 14, the intermediate frequency signal enters the low-pass filter 186 via a 50 ohm input line 218, and passes into a circuit layout comprising a capacitor element 220, an inductance element 222, a capacitor element 224, an inductance element 226, and a capacitor element 228, and then leaves by a 50 ohm output line 230. The capacitor elements 220, 224 and 228 have respective values of 0.0829 pF, 0.073 pF and 0.0734 pF, and the inductance elements 222 and 226 have respective values of 0.416 nH and 0.2604 nH. The output line from the ring mixer 52 also includes an intermediate frequency bypass capacitor 232 and an output port 234 (see FIG. 13).

Operation of the Radar System

The operation of the radar system of the preferred embodiment of the present invention will now be described with reference to FIGS. 15 and 16 of the accompanying drawings.

Figure 15:
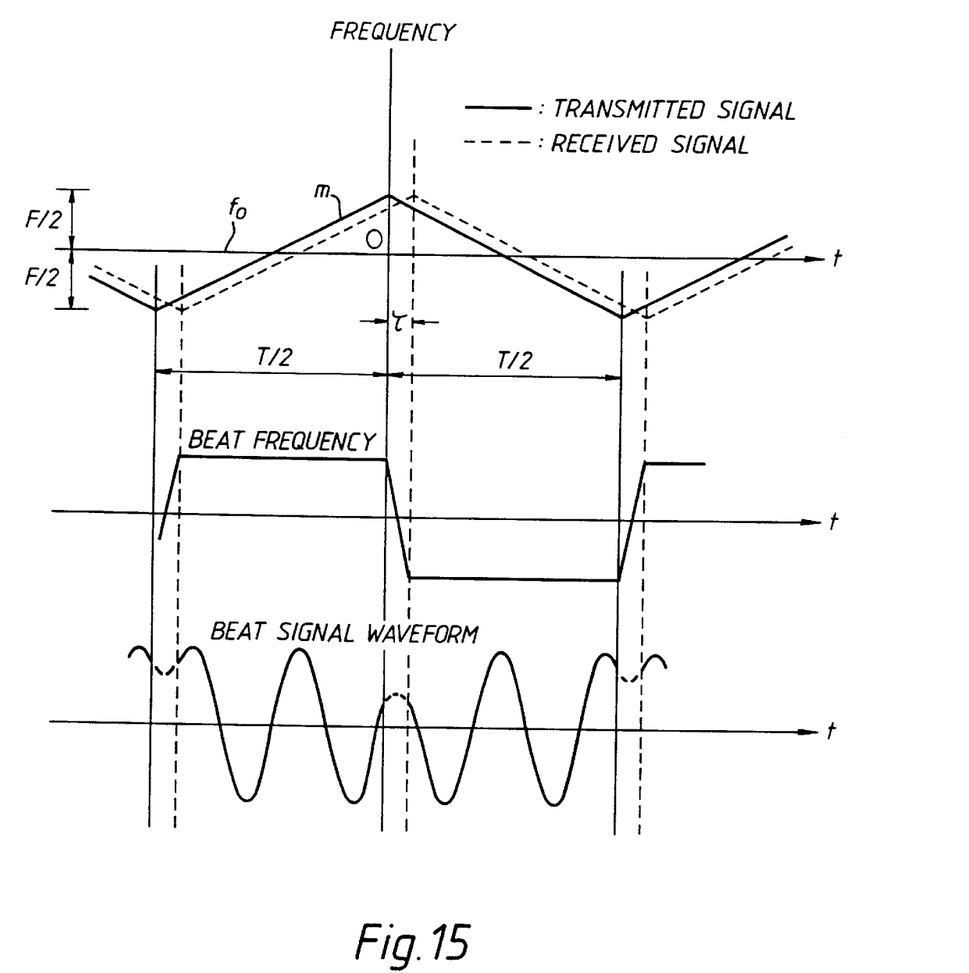
FIG. 15 is a schematic diagram showing the wave forms of transmitted, received and beat frequencies generated during operation of the radar system shown in FIG. 1.

The transmitted, received and intermediate frequencies produced during the operation of the radar system are shown graphically in FIG. 15. In FIG. 15, the carrier frequency is shown as $f_o$, the time as t, the maximum frequency deviation as F, the modulation period as T, and the round-trip time for the transmitted signal to reach an object and to return to the receive antenna is shown as τ. The round-trip time τ taken for the signal to traverse a distance R to a detected object and to return will be 2R/c, where c represents the velocity of light.

The transmitted signal ($T_x$) shown as a solid line curve in the upper portion of FIG. 15 is the frequency-modulated output of the VCO 34 produced as a result of applying a saw-tooth voltage signal from the linear ramp generator 48 to the input of the summing amplifier 46 (see FIG. 1). The received signal ($R_x$) shown as a broken line in the upper portion of FIG. 15 is separated from the transmitted signal by the round-trip time τ. The beat frequency (B) curve shown in the mid-portion of FIG. 15 is the intermediate frequency output of the hybrid ring mixer 52 shown in FIG. 1.

The slope of the transmitted signal, labelled as m, is a key parameter in the operation of the system. If one considers the increasing portion of the ramped transmitted signal, the slope m of the curve is given by the expression:

m=B/Displacement between $T_x$ and $R_x$, but τ=the displacement between $T_x$ and $R_x$, therefore:

$$m = B/\tau \quad (1).$$

But the slope m is also given by the expression:

$$m = F/(T/2) = 2F/T \quad (2).$$

Equating these two values of the slope to each other and then solving for τ yields:

$$\tau = TB/2F \quad (3).$$

Substituting τ=2R/c into equation (3) and solving for R yields:

$$R = TBc/4F \quad (4).$$

This equation shows that, if parameters T and F are known, then the measurement of the beat frequency B enables the range R of a detected object to be obtained.

Two cases must be considered which affect the beat frequency that is measured. The first case (case 1) is that of detecting stationary objects, and the second case (case 2) is that of detecting moving objects.

Considering now case 1, if the object is stationary, then it cannot produce a Doppler shift in the received signal. Consequently the beat frequency obtained must be derived solely from the distance of the detected object from the user of the SMART system, i.e., the delay between $T_x$ and $R_x$. Thus the beat frequency for the increasing portion of these signals is equal and opposite to the decreasing portion of these signals. This is the situation shown graphically in FIG. 15, and the beat frequency detected in case 1 will be referred to hereinafter as $B_r$.

Case 2 involves also the consideration of a Doppler frequency Fd produced as a result of the movement of the detected object. If the detected object is moving towards the user of the SMART system, then the beat frequency detected will be reduced by the Doppler frequency $F_d$. If the beat frequency measured on the increasing portion of the signal is designated as $B_{up}$, then:

$$B_{up} = B_r - F_d \quad (5).$$

If the beat frequency measured on the decreasing portion of the signal is designated as $B_{down}$, then this frequency will be increased by the Doppler frequency $F_d$. Accordingly:

$$B_{down} = B_r + F_d \quad (6).$$

The information on the range of the detected object from the user of the SMART system can now be obtained by averaging the beats over the cycle, i.e., $$B_r = (B_{up} + B_{down})/2 \quad (7).$$

The information on the velocity of the detected object relative to the user of the SMART system can now be obtained by subtracting the beats in the decreasing portion of the signal from those in the increasing portion of the signal, i.e., $$F_d = (B_{down} - B_{up})/2 \quad (8).$$

The various measurements are obtained using digital techniques, after converting the signals from analogue signals to digital signals in the ADC 58, and then processing the digital signals in the signal processing unit 60 (see FIG. 1). The signal processing unit 60 used may be any one of a number of commercially-available signal processing units which can derive the desired information from the digital signals in the output from the ADC 58. Consequently, there is no need to disclose a specific circuit configuration for the signal processing unit 60.

The procedure for calculating the beat frequencies, and hence the range and velocity of the object detected by the user of the SMART system, will now be described. The beat frequency signal is shaped into a rectangular wave form, as shown in FIG. 15. The zero-crossing rate is measured when the beat frequency slope is positive, i.e., it is counted once per modulation period T. An alternative method is to count the zero-crossing rate when the beat frequency slope is positive and when the beat frequency slope is negative, i.e., twice during half a modulation period.

This means the maximum error E in a range measurement is half the wavelength of the beat signal, i.e., $$E = c/4F \tag{9}$$

If the maximum frequency deviation is taken as 300 MHz, then the maximum error E is 25 cm. This error, which is inherent in frequency counting, is termed the step error. This error could be reduced by increasing F.

The Doppler frequency $F_d$ is a function of the wavelength $\lambda$ of the carrier frequency $f_o$ and the velocity V of the object detected relative to the user of the SMART system, as follows:

$$F_d = 2V/\lambda \tag{10}$$

Substituting $B_r$ for B in equation (4) yields:

$$R = TB_r c/4F \tag{11}$$

When, for example, the object detected is at a range of 2 metres from the user of the SMART system, then the beat frequency $B_r$, which can be derived directly from equation (11), has a value of 2 KHz when T=0.004 seconds, F=300 MHz and c=3×10$^{10}$ cm/sec. The wavelength $\lambda_o$ of the carrier signal, from the equation $\lambda_o = c/f_o$, is 3.19 mm. If the velocity V of the object detected relative to the user of the SMART system is 1 metre/second, then the substitution of these values into equation (10) yields a value for the Doppler frequency $F_d$ of 2 KHz. When the intermediate frequency signal is mixed down by the signal processing unit 60 to obtain an audio output, both $B_r$ and $F_d$ lie in the lower portion of the audio range detectable by the user of the SMART system.

Figure 16:
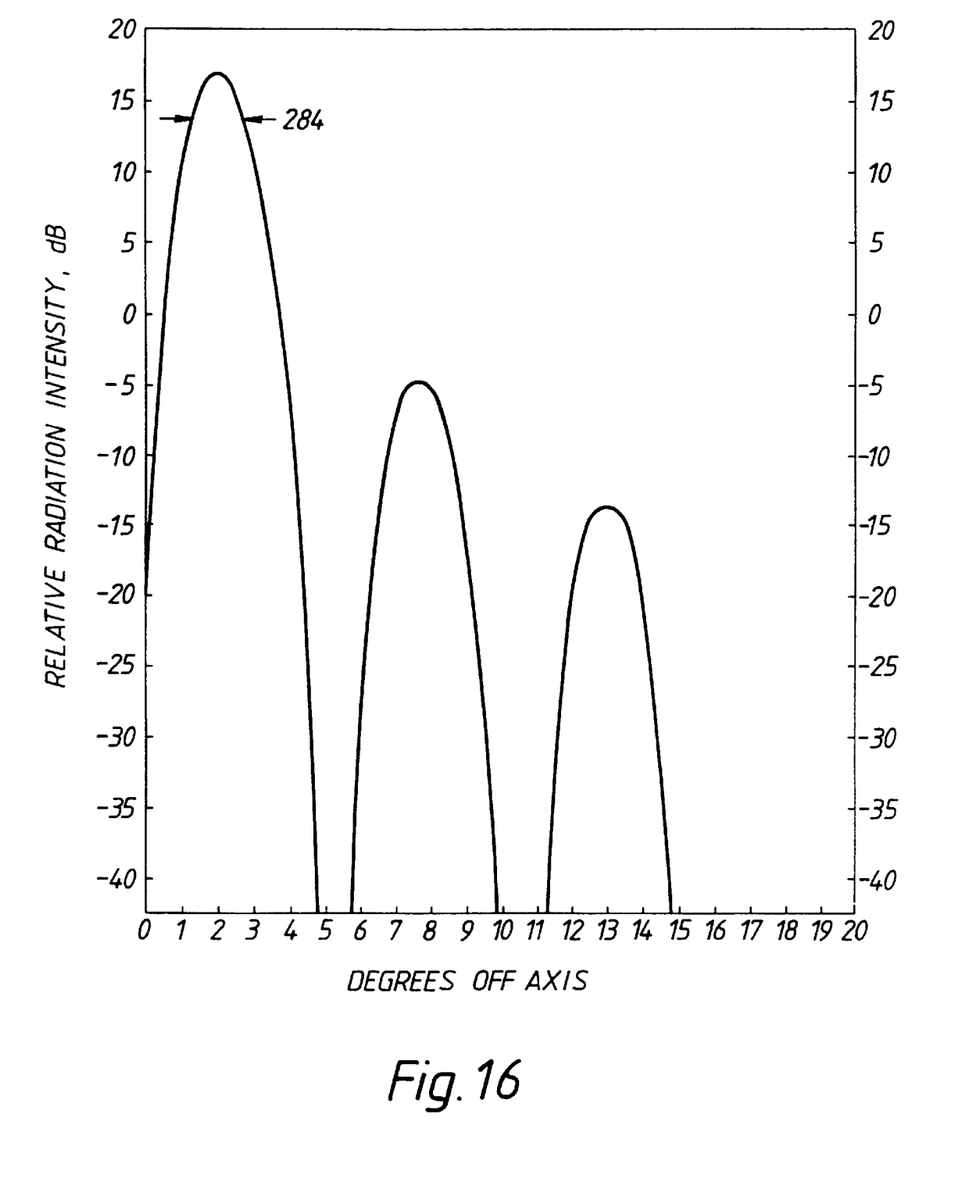
FIG. 16 is a graphical representation of the radiation pattern generated at the planar phased array shown in FIG. 7.

Referring now to FIG. 16, this shows the radiation pattern produced by the planar phased array shown in FIG. 7. Reference numeral 284 indicates the half-power or 3 dB points for the radiation pattern, showing that the planar phased array used for both the transmit antenna 30 and the receive antenna 32 has a beam width of 1.43 degrees. This is a very narrow beam width, similar to that of a pencil beam, and helps a user of the SMART system of the invention to readily distinguish one object from another when the radiation pattern from the transmit antenna 30 is used to scan the environment in front of the user.

The slope m of the transmitted signal must be constant in order for equation (3) to be valid. That is to say, equation (1) is only equal to equation (2) for a constant slope m. Varactor-tuned Gunn oscillators have variations in the tuning slopes thereof which can amount to 40% to 50%. Thus the tuneable oscillator 34 of the SMART system of the present invention must be stabilised in order to obtain correct range and velocity information from the system. This is accomplished by using feedback with the linear frequency discriminator 44 in the feedback loop comprising the circuit elements 34, 36, 38, 40, 42, 44 and 46 shown in FIG. 1.

Referring now to FIG. 11c, in particular to the linear portion of the curve of the output signal that occurs between the trough 214 and the peak 216, this graph has a scale of 10 MHz/division for the frequency and 5 mv/division for the output signal voltage. Thus the linear region of the curve between the trough 214 and the peak 216 has a slope of 0.5 mv/MHz, and represents the sensitivity of the linear frequency discriminator 44. If each one of the matching networks 144, 146, 152 and 154 has a gain of 5, then the path from the power splitter 142 to the signal output 160 via either resonator 148 or resonator 150 has an overall gain of 25. This produces a sensitivity of 12.5 mv/MHz for the discriminator 44. The matching networks 144, 146, 152 and 154 can be formed from FETs (Field Effect Transistors) which can incorporate the necessary gain.

The sub harmonic mixer 38 shown in FIG. 10 has a conversion loss of 20 dB. The amplifier 42 in FIG. 1 has a gain of 43 dB, giving an overall loop gain of 200, or 23 dB. The discriminator sensitivity of 12.5 mv/MHz plus the closed loop gain of 200 produces a 0.5% variation in linearity, which is more than adequate for a constant slope m. The accepted value for the variation from linearity is 1%.

The SMART system parameters for the preferred embodiment of the present invention are as follows:
Transmitter power:
  Fire fighting SMART systems—1–5 milliwatts,
  Blind or partially-sighted users—1 microwatt.

| | |
|---|---|
| Carrier signal frequency: | 94 GHz. |
| Modulating frequency: | 250 Hz. |
| Maximum modulation frequency excursion: | 300 MHz. |
| Closed loop local oscillator frequency: | 23.25 GHz. |
| Sub harmonic (N = 4) mixer conversion loss: | 20 dB. |
| Closed loop intermediate frequency: | 1 GHz. |
| Closed loop amplifier gain: | 43 dB. |
| Linear frequency discriminator sensitivity: | 12.5 mv/MHz |
| Antenna gain: | 16.8 dB. |
| Antenna beam width (in degrees): | 1.428. |
| Receiver hybrid ring mixer conversion loss: | 6 dB. |
| Receiver IF amplifier gain: | 30 dB. |
| Receiver IF amplifier bandwidth: | 250 MHz. |

A SMART system according to the preferred embodiment of the invention, having these parameters, is capable of detecting an object having a radar cross-section of 0.1 m$^2$ at a distance of 87 metres with a transmitter power of 1 microwatt. With a transmitter power of 1 milliwatt, the same SMART system is capable of detecting the aforesaid object at a distance of 495 metres.

Millimetre wave radiation is subjected to an attenuation of approximately 3 dB/Km in thick fog, but, in an electronic viewing aid according to the present invention that is designed to be used by fire-fighters, it is preferable to use a transmitter power of 1 milliwatt because of the additional attenuation produced by the presence of smoke and/or dust in the fire fighting environment. An electronic viewing aid according to the present invention provided with a transmitter having a power of 1 milliwatt could be used by fire-fighters without power modification, and by blind or partially-sighted people by inserting an attenuator between the transmitter and the antenna of the SMART system. The insertion of an attenuator having 30 dB of attenuation will decrease the output power received by the antenna of the SMART system to 1 microwatt.

The narrow beam width of the transmitted signal from the SMART system of the preferred embodiment of the present invention means that an object that is only 2.5 cm wide can be detected by a user of the SMART system at a range of 1 metre. Consequently, the user of the SMART system can detect various objects present in the user's near environment by movement of the user's head horizontally or vertically, so scanning the near environment in both directions.

Figure 17:
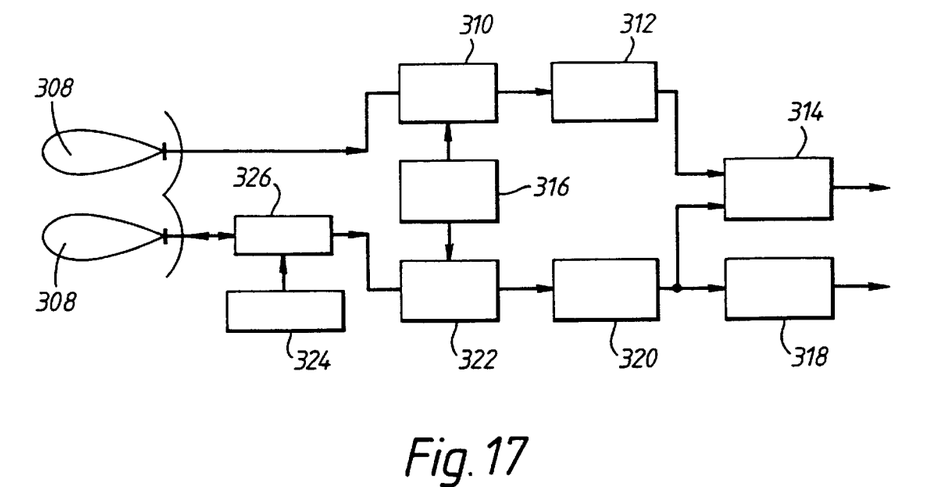
FIG. 17 is a schematic block diagram of a second embodiment of a radar system of an electronic viewing aid according to the present invention.
Figure 18:
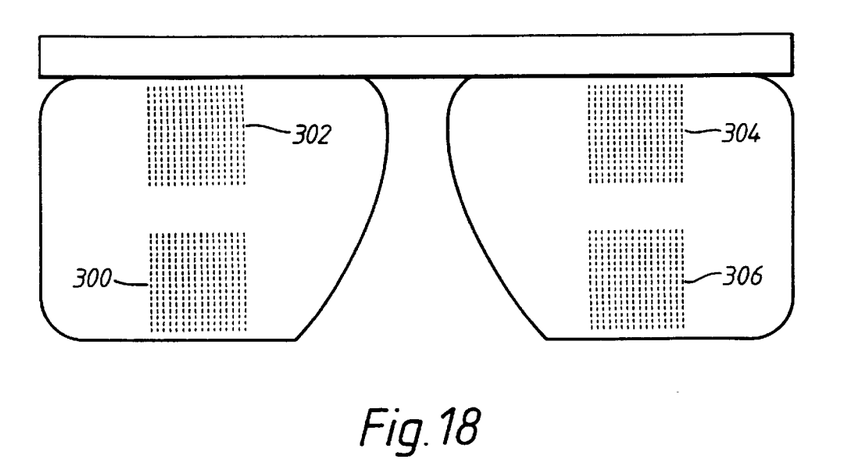
FIG. 18 is a front view of a pair of spectacles which forms a front end assembly of the radar system shown in FIG. 17.

FIGS. 17 and 18 disclose another embodiment of an electronic viewing device according to the present invention in which the radar system used is a phase comparison monopulse system. FIG. 17 shows the circuit configuration for a phase comparison monopulse system having one degree of freedom, and FIG. 18 shows a front view of a SMART system having four planar phased arrays 300, 302, 304 and 306 which form antennae for the phase comparison monopulse system shown in FIG. 17.

Referring now to FIG. 17, the reference numerals 308 indicate antenna radiation patterns for the transmit and receive antennae. A duplexer (a $T_x/R_x$ switch) 326 is coupled to the antennae, and receives a transmitter signal from a transmitter 324. An output from the duplexer 326 is fed to one input of a mixer 322, which mixer 322 also receives an input signal from a local oscillator 316. An output from the mixer 322 is fed to an intermediate frequency amplifier 320, which amplifier 320 produces an output signal which is passed to an envelope detector 318. The reflected signal from a detected object received by the antennae is fed to one input of a mixer 310, which mixer 310 also receives an input signal from the local oscillator 316. An output from the mixer 310 is fed into an intermediate frequency amplifier 312, which amplifier 312 produces an output signal which is fed into one input of a phase detector 314. The output signal from the amplifier 320 is also fed to a second input of the phase detector 314.

An output signal from the phase detector 314 provides angle-error information on the detected object, whilst an output signal from the envelope detector 318 provides information on the range of the detected object from the user of the SMART system.

An electronic viewing aid according to the second embodiment of the invention which could provide angle-error information on detected objects for two degrees of freedom would require the inclusion of further phase detector circuitry, which, in turn, would increase the overall cost of the viewing aid in comparison to the preferred embodiment of the invention shown in FIGS. 1 to 16 of the accompanying drawings.

In the preferred embodiment of the present invention, the radar system is divided into two sections, one section dealing with analogue signals, the other dealing with digital signals. The section dealing with the analogue signals comprises the SMART system 22, with all the analogue circuitry being mounted on the spectacles, whilst the section dealing with the digital signals, the signal processing unit 24, is located in the belt-pack. The digital circuits used in the signal processing unit 24 produce stray radiation during the operation thereof, as a result of the production of wave forms having fast rise and fall times. Consequently, the physical separation of the radar system into analogue and digital sections provides those sections with radio-frequency isolation from one another, which is an important electromagnetic compatibility feature of this preferred embodiment of the invention.

The fabrication of the SMART system of the preferred embodiment of the present invention involves the use of various dielectric substrates for supporting the antennae, the electronic components, and the transmission lines of the system. Any dielectric substrate having a sufficiently high dielectric constant and sufficient structural strength may be used for this purpose. Thus, for example, suitable dielectric substrates could be farmed from polytetrafluoroethylene (dielectric constant of 2.45), quartz (dielectric constant of 4.5), alumina (dielectric constant of 9.6), RT/Duroid 6010 (dielectric constant of 10.3), GaAs (dielectric constant of 12.5), fused silica (dielectric constant of 3.6), beryllia (dielectric constant of 6.5), and sapphire (dielectric constant of 9.3). The planar phased arrays used in the SMART system are preferably made of copper, but any highly electrically-conductive metal or metal alloy can be used, such as gold or silver.

INDUSTRIAL APPLICABILITY

An electronic viewing aid according to the present invention provides a lightweight, miniaturised radar system that can be worn by a person so as to enable that person to detect the presence of objects in the immediate vicinity of that person, in the event that the vision of that person is either markedly decreased from normal or is absent. The radar system operates with millimetre wavelength radiation having an operating frequency lying between 35 and 220 GHz, which radiation has an attenuation of only approximately 3 dB/km in thick fog, and which can also penetrate smoke, dust and flame without undue attenuation. Consequently, an electronic viewing aid according to the present invention could be used by fire-fighters as a useful means of entering, searching, and moving about in smoke-filled, burning buildings.

Preferably the electronic viewing aid of the present invention is a radar system which includes an analogue section which can be worn as a pair of spectacles (a SMART system, referred to hereinbefore) or mounted on a helmet worn on the head of a user, and a digital section including signal processing circuitry, audio interface and power supplies which is worn in a belt-pack, a chest-pack or a back-pack by the user.

The preferred embodiment of the invention, which utilises the aforesaid SMART system, is designed primarily for the use of blind or partially-sighted people, and it allows such people to readily detect and to track both stationary and moving objects. Consequently, such people would not then require assistance from any other sighted person, sighted animal, or detection cane or similar device, in order to walk indoors or outdoors without colliding with, or being obstructed by, any stationary or moving object in the immediate environment thereof.

The SMART system used in the preferred embodiment of the present system utilises the head of the user as a scanning mechanism, thus enabling the system to use narrow beams of radiation, which is a desirable feature for producing accurate detection and recognition of objects sensed by the system. The SMART system produces such narrow beams of radiation by the use of the planar phased arrays which form the transmit antenna and the receive antenna of the system, the beam width of the radiation being determined by the number of elements present in the array.

The SMART system of the preferred embodiment of the invention achieves the necessary lightness and compactness required for a fully portable radar system by using microstrip fabrication techniques to form the transmission lines and passive components for the radio-frequency and intermediate frequency portions of the circuitry, and by using thick film hybrid techniques to form the low frequency components of the circuitry. There is no necessity to include any form of wave guides in the SMART system, as is the situation with conventional radar systems.

In the SMART system of the preferred embodiment of the present invention, the transmitter is located on the front upper support of the spectacles, with the electronic components of the closed frequency loop, including the local oscillator stabilised by the dielectric resonator on one of the side supports, and with the electronic components of the receiver on the other side support. This arrangement provides radio-frequency isolation between all the active devices of the system. It may also be desirable to provide the circuits of the system with metal coverings for protection against external radio-frequency interference.

An electronic viewing aid according to the present invention detects both stationary and moving objects by a phase-shift radar system, which is either arranged to count the frequency of the phase change between a transmitted signal and a received signal, or is arranged to measure the actual change in phase between a transmitted signal and a received signal. In the preferred embodiment of the present invention, the frequency of the phase change between a transmitted signal and a received signal is counted, since this is relatively cheap to accomplish, and has low power consumption requirements, both of which are important factors in the overall commercial design of the electronic viewing aid of the present invention.

I claim:

1. An electronic viewing aid, comprising:

an electromagnetic oscillation system including a transmitter and a receiver each of which is constructed and arranged to be worn by a person, an electrical power source coupled to the transmitter and the receiver, a signal processing unit, and a sensory output device coupled to an output of the signal processing unit, wherein the electromagnetic oscillation system is a small-scale, lightweight, fully portable personal radar system adapted to be worn by said person, which radar system is a phase-shift radar system which has low power consumption requirements and is constructed and arranged for detecting both the range and the relative velocity of stationary and moving objects;

said personal radar system including a miniaturized radar front end assembly constructed and arranged to produce millimeter wavelength electromagnetic radiation, planar phased array antennae which have very narrow beam width characteristics, and a linearly-tuned voltage-controlled oscillator arranged in said transmitter as a source of said electromagnetic radiation.

2. An electronic viewing aid according to claim 1, in which the personal radar system (22,24) has low power consumption requirements of not more than 5 milliwatts during the operation thereof.

3. An electronic viewing aid according to claim 1, in which the planar phased array antennae (30,32) have a beam width characteristic of no more than 2 degrees at 94 GHz.

4. An electronic viewing aid according to claim 1, in which said voltage-controlled oscillator (34) is configured to provide an output signal to the transmit antenna (30) of the planar phased array antennae (30,32), and including a feedback loop (34,36,38,40,42,44,46) in said transmitter configured to stabilize the operation of the voltage-controlled oscillator (34).

5. An electronic viewing aid according to claim 1, in which the radar front end assembly (22) is adapted to be worn on the head of said person.

6. An electronic viewing aid according to claim 1, in which the radar front end assembly (22) is constructed in the form of a pair of spectacles, in which both a transmit antenna (30) and a receive antenna (32) of the radar system are carried on respective lens elements (75) of the spectacles and analogue portions (38,40,42,52,54,56) of both a transmitter circuit and a receiver circuit are carried on respective side support frames (82,84) of the spectacles.

7. An electronic viewing aid according to claim 1, in which the electronic viewing aid is devised to operate with electromagnetic radiation of a frequency which lies between 35 and 220 gigahertz (GHz).

8. An electronic viewing aid according to claim 6, in which the frequency of the electromagnetic radiation is 94 GHz.

9. An electronic viewing aid according to claim 1, in which the miniaturised radar front end assembly (22), when in use, is spaced apart from the signal processing means (24).

10. An electronic viewing aid according to claim 1, in which the electrical power source and the signal processing unit (24) are both mounted in a convenient package designed to be worn as either a belt-pack, a chest-pack, or a back-pack by said person.

11. An electronic viewing aid according to claim 1, in which the sensory output device is an audio output device, and delivers an audio signal directly to earphones (98) worn by said person.

12. An electronic viewing aid according to claim 1, in which the radar system (22,24) is a frequency-modulated continuous wave type.

* * * * *